US 6,595,786 B2
Jul. 22, 2003

(54) ELECTRICAL CONNECTING STRUCTURE OF MOUNTED PART, COMPUTER APPARATUS, AND ELECTRONIC EQUIPMENT

(75) Inventors: Mitsuo Horiuchi, Sagamihara (JP); Kenshin Yonemochi, Kamakura (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/815,325

(22) Filed: Mar. 22, 2001

(65) Prior Publication Data

US 2001/0029128 A1 Oct. 11, 2001

(30) Foreign Application Priority Data

Apr. 7, 2000 (JP) .................................... 2000-106280

(51) Int. Cl.⁷ ................................................. H01R 9/09
(52) U.S. Cl. ........................................ 439/74; 361/680
(58) Field of Search .................. 439/74, 247, 248, 439/341, 376, 77, 502; 361/683, 680, 749, 784, 785, 803, 802

(56) References Cited

U.S. PATENT DOCUMENTS

| 3,112,974 | A | * | 12/1963 | Curtis et al. ................ 439/292 |
| 4,579,408 | A | * | 4/1986 | Sasaki ........................ 439/153 |
| 4,621,305 | A | * | 11/1986 | Daum ........................ 361/398 |
| 4,824,379 | A | * | 4/1989 | Boberts et al. ............... 439/77 |
| 4,832,619 | A | * | 5/1989 | Eck et al. .................... 439/377 |
| 4,842,543 | A | * | 6/1989 | Davis ........................ 439/378 |
| 4,940,417 | A | * | 7/1990 | Hyogo et al. ............... 439/248 |
| 5,000,693 | A | * | 3/1991 | Hatagishi et al. ........... 439/248 |
| 5,244,410 | A | * | 9/1993 | Demus et al. .............. 439/497 |
| 5,299,944 | A | * | 4/1994 | Larabell et al. ............ 439/157 |
| 5,362,243 | A | | 11/1994 | Huss et al. ................... 439/76 |
| 5,460,530 | A | * | 10/1995 | Toba et al. .................. 439/34 |
| 5,661,634 | A | * | 8/1997 | Obata et al. ................ 361/684 |
| 5,847,924 | A | * | 12/1998 | Youn ......................... 361/686 |
| 5,857,863 | A | * | 1/1999 | Onizuka et al. ........... 439/248 |
| 5,980,291 | A | * | 11/1999 | Ono ........................... 439/247 |
| 6,053,747 | A | | 4/2000 | Aggus et al. ................. 439/67 |
| 6,101,088 | A | * | 8/2000 | Nakajima et al. .......... 361/686 |
| 6,119,184 | A | * | 9/2000 | Takahama .................. 710/101 |
| 6,175,488 | B1 | * | 1/2001 | Seto et al. .................. 361/683 |
| 6,208,508 | B1 | * | 3/2001 | Ruch et al. ................ 361/686 |
| 6,256,208 | B1 | | 7/2001 | Supinski et al. ........... 361/784 |
| 6,296,502 | B1 | | 10/2001 | Takata et al. .............. 439/248 |

* cited by examiner

Primary Examiner—Lynn D. Feild
Assistant Examiner—Thanh-Tam Le
(74) Attorney, Agent, or Firm—Andrew J. Wojnicki, Jr., Esq.; Blanche E. Schiller, Esq.; Heslin Rothenberg Farley & Mesiti P.C.

(57) ABSTRACT

To obtain connector connecting structure that makes it easy to connect connectors when a mounted part is mounted in a part-receiving part. In a keyboard unit mounted in a PC body of a notebook PC, a connector implemented on a flexible cable is movably supported through a cushion, which is made of urethane rubber and is fixed on a installation side 14B of the keyboard unit, and a support plate fixed to the cushion. Owing to this, by just mounting the keyboard unit in the PC body, the connector is connected to the connector in the PC body side, and hence connection becomes simple. Therefore, even if the misalignment between the connectors and arises, the connector moves according to an amount of the misalignment, and hence adequate connection can be performed.

17 Claims, 13 Drawing Sheets

ELECTRICAL CONNECTING STRUCTURE OF MOUNTED PART, COMPUTER APPARATUS, AND ELECTRONIC EQUIPMENT

CROSS-REFERENCE TO RELATED APPLICATIONS

This application claims priority from Japanese patent application number 2000-106280, filed Apr. 7, 2000, which is hereby incorporated herein by reference in its entirety.

TECHNICAL FIELD

The present invention relates to an electrical connecting structure of a mounted part that is applied to a computer apparatus and electronic equipment, and in particular, to an electrical connecting structure of a mounted part by which connector connection is completed by just mounting the mounted part in a part-receiving part when a connector provided in a mounted part side is electrically connected to a connector provided in a part-receiving part side, and a computer apparatus and electronic equipment that have the electrical connecting structure of the mounted part.

BACKGROUND ART

Generally speaking, electronic equipment uses connectors for electrically connecting a circuit board, an electronic part, an electronic device, or the like. Major part of electronic equipment is manually connected with connectors at the time of assembling the electronic equipment.

For example, in a notebook type personal computer (hereinafter, a notebook PC) 100 shown in FIG. 10, connector connection is performed with such manual operation when a keyboard unit 102 is mounted in a PC body 104 of the notebook PC 100.

It is necessary to mount the keyboard unit 102 in a part-mounted section 106 of the PC body 104 without play and a gap because of functional and appearance specifications or the like. Therefore, an outer periphery 102A of the keyboard unit 102 and a part-mounted section 106 are produced so as to accurately fit with each other.

In addition, a connector (a male connector) 114 is a companion of a connector (a female connector) 112 attached on a mother board 110 in the PC body 104. Furthermore, this connector 114 is attached in an end section of a flexible printed circuit cable (hereinafter, an FPC cable) 108 extending from an approximate center of a rear end section of the keyboard unit 102. Therefore, the keyboard unit 102 is electrically connected to a system unit (PC body 104) through the connector 114 connected to this FPC cable 108 and the connector 112.

Here, issues at the time of attaching a connector to a keyboard unit will be described.

The simplest method for attaching the connector is to directly attach and fix the connector to an installation side (reference symbol 102B in FIG. 10) of the keyboard unit. Thus, the connector in the keyboard unit side is located at a position facing the connector in the mother board side with the keyboard unit being mounted in the PC body, and is fixed with adjusting height (direction of thickness in the PC body) so as to obtain proper insertion depth. Owing to such a form, it becomes possible to mount the keyboard unit and simultaneously connect connectors with each other.

For example, Published Unexamined Patent Application No. 4-66628 and Published Unexamined Patent Application No. 7-99553 disclose such a structure that a connector is attached to an installation side of a keyboard unit.

In this art, it is proposed that a key-top section corresponding to the structure of an upper section of a keyboard is detachable from a keyboard body. Therefore, in each invention, a connector for connection to the keyboard body is directly attached and fixed to the installation side of the key-top section. It is said that, owing to this, it becomes possible to easily correspond to changes of key size and key arrangement by just changing the key-top section. Alternatively, it is said that it becomes convenient to change the key-top section.

Nevertheless, usually, the key-top section is mounted with any alignment with a keyboard body in some degree. For example, in case of a notebook PC, a key-top section is aligned with an outer periphery of a keyboard unit being fitted with a part-mounted section of the PC body.

For this reason, it is impossible to relatively move the keyboard unit 102 to the PC body within a plane of the installation side and to perform fine adjustment of a mounted position. Therefore, so as to adopt such structure that a connector is directly fixed to the keyboard unit, it is necessary to attach connectors with high precision by suppressing misalignment, arising between both connectors, as small as possible.

This is because there is a problem that a connector and/or a board are damaged due to applying an excessive force to the connector at the time of mounting the keyboard unit if the connector is largely misaligned. Hence, there is a high possibility of leading to a continuity failure due to stress concentration and a cracking in a lead section and/or lands (an electrode section) in a board side, which are soldered by reflow soldering, because such a state that enforced alignment is kept also after connection of the connectors. These are common to a DIP type connector or the like as well as a surface-mounted connector.

Nevertheless, in actual mass production, connector positions in a keyboard unit side and a mother board side naturally fluctuate due to manufacturing accuracy and a number of parts, an actual mounting method, an implementation method, or the like. Therefore, it is difficult to suppress an amount of misalignment of the connector within an allowance for clearing the above-described problems with adding manufacturing quality (dimensional tolerance) of components constituting the keyboard unit and PC body. Even if this is realized, this PC will be expensive, and hence the cost effectiveness of the PC will be drastically lowered. Therefore, it is inconvenient just to merely fixedly attach the connector.

Then, in a conventional example shown in FIG. 10, the FPC cable 108, where an electric circuit is formed on a thin-plate-like flexible substrate, is provided in the keyboard unit 102. Therefore, it is possible to move the connector 114 by attaching the connector 114 in an end section of this cable, and hence the above-described problems can be solved.

In order to mount this keyboard unit 102 in the PC body 104, first, with orienting and holding the keyboard unit 102 in a direction shown in FIG. 11 with one hand, the connector 114 located in the end section of the cable is inserted into and connected to the connector 112 in the mother board 110 (FIG. 12).

After connection of the connectors, the FPC cable 108 is lowered below the keyboard unit 102 and treated so as not to be pinched, and an end section of the keyboard unit 102 is fitted into a receiving section 116 in the PC body 104.

Furthermore, the keyboard unit 102 is temporarily fixed by a side section of the keyboard unit 102 being latched with latches 118 that are convexly provided in the part-mounted section 106 and can protrude and recess.

Mounting is completed by fixing the keyboard unit 102 on supports 120, which are stood on an installation side 102B of the keyboard unit 102, lest the keyboard unit 102 should be detached by fastening screws 122 from the bottom face (installation face) of the PC main body 104 (FIG. 13).

In this manner, when the keyboard unit 102 is mounted in the PC body 104, the connector 114, becoming movable through the FPC cable 108, is first connected, and then the keyboard unit 102 is mounted. Therefore, an excessive force never acts on the connectors 112 and 114, and the mother board 110 when the keyboard unit 102 is mounted. In addition, stress is not applied to the connectors 112 and 114, and FPC cable 108 also after connection.

Nevertheless, in such a conventional electrical connecting structure described above, the connector 112 in a system side that is mounted on the mother board 110 is located with entering inside the PC body 104, and is hidden by the keyboard unit 102 positioned on this side when being connected to the connector 114 (operation shown in FIGS. 11 and 12). Therefore, it is difficult to align the connectors. If the connector 112 is forcibly pushed in a state of incomplete alignment, there is a possibility of damaging the connector(s), and further, skill is required because it is necessary to perform the connection with one hand.

In addition, when the keyboard unit 102 is lifted alone, the FPC cable 108 hangs under the own weight of the connector 114. Hence there is a probability of catching and damaging the FPC cable 108.

On the other hand, when the keyboard unit 102 is detached, there is also a possibility of the FPC cable 108 and soldered sections of the connectors 112 and 114 being pulled and damaged if the keyboard unit 102 is erroneously lifted without unplugging the connector 114 (in a state of connection).

SUMMARY OF THE INVENTION

The present invention has been made in view of the above-described facts and provides an electrical connecting structure of a mounted part that facilitates insertion and detachment of a connector when the mounted part is mounted in or dismounted from a part-receiving part, and that prevents the damage of the connector and an FPC cable when the mounted part is mounted and dismounted, and a computer apparatus and electronic equipment to which the electrical connecting structure of a mounted part is applied.

An aspect of the present invention for achieving the above object is an electrical connecting structure for electrically connecting a component constituting a part of an electronic equipment to another part of the electronic equipment by fitting the component to another part of the electronic equipment, the structure comprising: a first connector provided in the component; a support member movably supporting the first connector in the first component; and a second connector provided in another part of the electronic equipment, the second connector to be used for connecting with the first connector.

The above-described electrical connecting structure of a mounted part has such configuration that the first connector can relatively move to the mounted part by providing the supporting member, which movably supports the first connector, on the mounted part. Any material can be used as this supporting member so long as the material can movably support the first connector, and hence a spring member made of metal or resin can be used.

Owing to this, not only the mounted part is mounted in the part-receiving part, but also the first connector in a mounted part side is connected to the second connector in a part-receiving part side. In addition, even if the first connector and second connector are misaligned, the first connector moves according to an amount of the misalignment, and hence a desired joint state can be obtained.

In this manner, since misalignment between both connectors is absorbed by the supporting member movably supporting the first connector, it is possible to resolve failures such as damage that arise when the connector is fixedly connected. In addition, since an excessive force does not act on both connectors also after connection, a continuity failure or the like due to the cracking of a soldered section do not arise.

Furthermore, since the first connector is attached in the mounted part through the supporting member, the first connector which has been inserted into the second connector is disconnected only by detaching the mounted part from the part-receiving part.

Therefore, since it is not necessary to separately insert or detach the connecter when the mounted part is mounted in or dismounted from the part-receiving part, it becomes simple to connect and disconnect the connector.

In addition, according to this configuration, even if the first and second connectors are surface-mounted type or DIP type connectors, similar effects can be obtained.

Furthermore, the above-described electrical connecting structure can also have the configuration in which the first connector is connected to an electronic circuit mounted on the component through a flexible cable.

It is preferable to use a flexible cable, which is easily bent and deformed, for electrically connecting the first connector to an electronic circuit mounted on a mounted part. This is because the first connector can move without being disturbed by the stiffness of the flexible cable.

In addition, another aspect of the present invention is an electrical connecting structure for electrically connecting a component constituting a part of an electronic equipment to another part of the electronic equipment by fitting the component to another part of the electronic equipment, the structure comprising: a first connector provided in another part of the electronic equipment; a support member movably supporting the first connector in another part of the electronic equipment; and a second connector provided in the component, the second connector to be used for connecting with the first connector.

The above-described electrical connecting structure of a mounted part has such configuration that a supporting member is provided in a part-receiving part and supports a first connector so as to be movable. In this manner, also in such configuration that a connector in a part-receiving part side (first connector) is made to move, it is possible to obtain an action and an effect that are similar to those in the above-described form of a connector in a mounted part side (first connector) moving.

In addition, this electrical connecting structure of a mounted part can also have the configuration of the first connector being connected to an electronic circuit, mounted on a part-receiving part, through a flexible cable. Here, similarly to the above-described form, it is preferable to use a flexible cable because the first connector can move without being disturbed by the stiffness of the flexible cable.

In addition, in still another aspect of the present invention, the above-described flexible cable is a flexible printed-circuit cable (FPC cable) where an electric circuit is formed with printed wiring on a plate-like substrate that can be bent and deformed. Furthermore, in the configuration of surface-mounting and attaching a first connector to this flexible printed-circuit cable, the flexible printed-circuit cable can have a form of absorbing a force applied to a first connector when the first connector and a second connector are connected to each other.

The form of absorbing a force applied to the first connector is the structure of being easily deformed by a force in a direction of pulling the cable or in a direction of twisting the cable such as thinning the cable width of the flexible printed-circuit cable, forming a hole or a notch in the cable, making the cable nonlinear, or loosening the cable with providing a coiled section.

Owing to this, even when the first connector is moved, the force acting on the flexible printed-circuit cable by the movement is relieved by the flexible deformation of the cable. Therefore, it never happens that an excessive stress is applied to a lead section of the first connector surface-mounted on the cable. Furthermore, since it never happens that the electronic circuit that is mounted on the mounted part or part-receiving part is also pulled through the flexible printed-circuit cable in connection with the movement of the first connector, the electronic circuit is prevented from being damaged.

In addition, in the above-described electrical connecting structure, a guide member for connecting the first connector to the second connector at the time of the component being fitted to the another part of the electronic equipment can be included in the component or another part of the electronic equipment.

This guide member can be made to be separate from the second connector or the first connector, which is movable, and be provided in the first or second connector in a state of being detachable from the first or second connector. Alternatively, this guide member can be formed in one piece in the first or second connector itself. In addition, this guide member can be provided in the component or another part of the electronic equipment.

Owing to this, even if an amount of misalignment between both connectors is large, the first connector is guided by the guide member and is aligned with the second connector. Therefore, it becomes possible to securely and smoothly connect both connectors.

Furthermore, in a further aspect of the present invention, for example, an elastic body made of a high molecular compound such as synthetic rubber and elastomer can be the above-described supporting member. Furthermore, it is preferable to select urethane rubber as the elastic body.

If the supporting member is an elastic body such as synthetic rubber, the elastic body becomes cheap because a complicated mechanism is unnecessary. In addition, if being the urethane rubber that is excellent in thermal resistance, anti-aging property (durability), or the like, it is possible to maintain original elasticity because of strength for thermal degradation even if heat generated by the operation of electronic equipment is applied in a state of being deformed by absorbing the misalignment of connectors. Therefore, it is possible to suppress the degradation of a function of supporting connectors and a moving function.

In addition, a still further aspect of the present invention is a computer apparatus or electronic equipment having the above-described electric connection structure of a mounted part.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Hereinafter, embodiments of the present invention will be described with reference to drawings.

Figure 1:
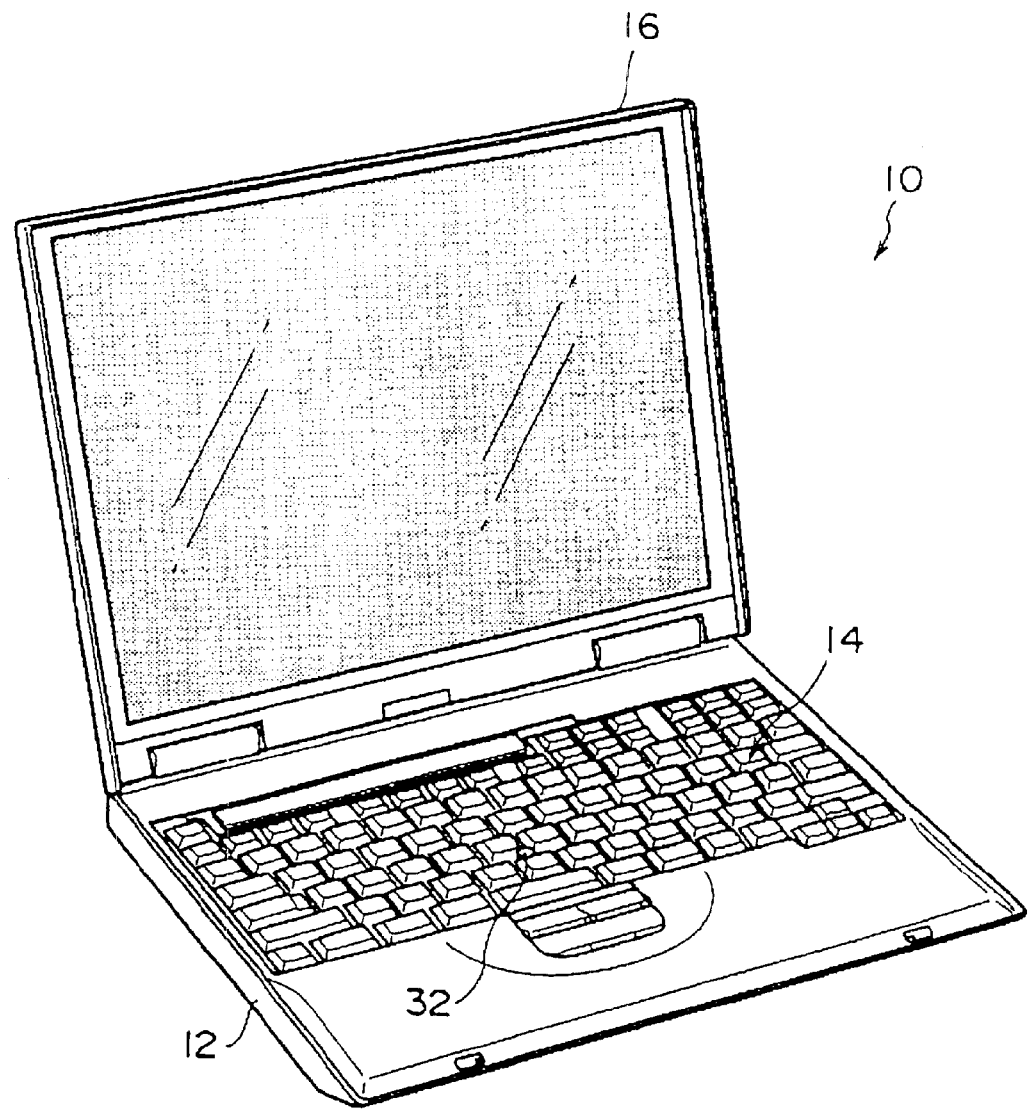
FIG. 1 is an outside view showing a notebook PC according to an embodiment of the present invention.
Figure 2:
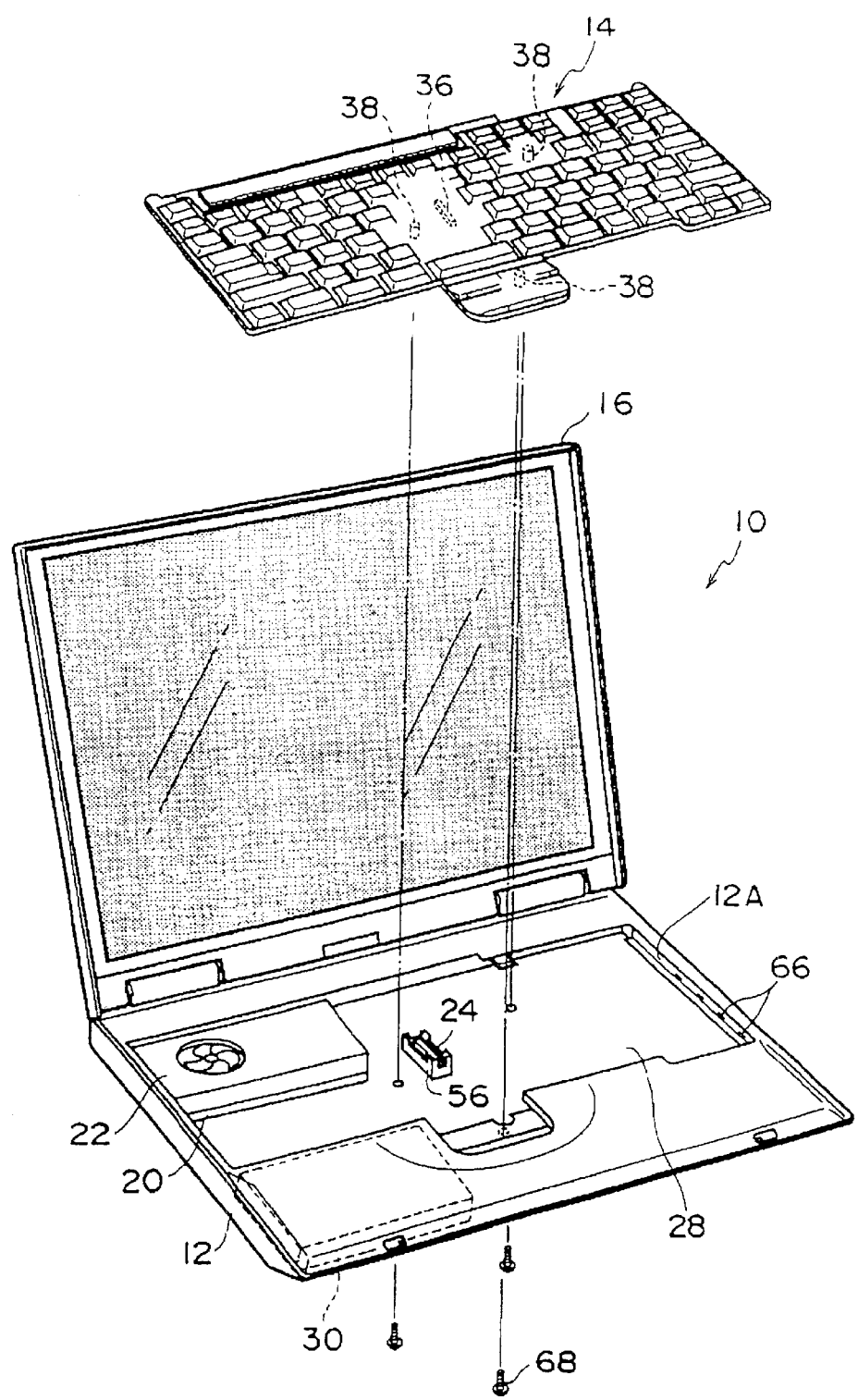
FIG. 2 is a schematic diagram showing a state of a keyboard unit being detached and the schematic configuration of the inside of a PC body in the notebook PC shown in FIG. 1.

FIGS. 1 and 2 show a notebook personal computer 10 (hereinafter, a notebook PC 10) according to a first embodiment of the present invention. As shown in FIG. 1, a keyboard unit 14 that is detachable is provided on a PC body 12 of the notebook PC 10 at the upper surface, and a liquid crystal display LCD) unit 16 is rotatably pivoted substantially in an back end of a periphery.

In addition, as shown in FIG. 2, a CPU card 20 where a CPU, a north bridge, or the like are implemented, a mother board 28 where a CPU cooler 22 cooling the CPU, a connector 24 for electrically connecting to the keyboard unit 14, memory, peripheral controller chip, or the like are implemented, and each peripheral equipment including each storage device such as a hard disk drive (HDD) 30, a floppy disk drive (FDD) not shown, a CD-ROM drive, or the like are embedded in the PC body 12.

Furthermore, a connector 24 on the mother board 28 is implemented with a longitudinal direction of the connector being made to fit in a back and forth direction of the PC body 12.

In addition, as before, the PC body 12 and keyboard unit 14 are also produced accurately lest play and a gap should arise between a part-mounted section 12A of the PC body 12 and a periphery 14A of the keyboard unit 14 when the keyboard unit 14 is mounted.

Figure 3:
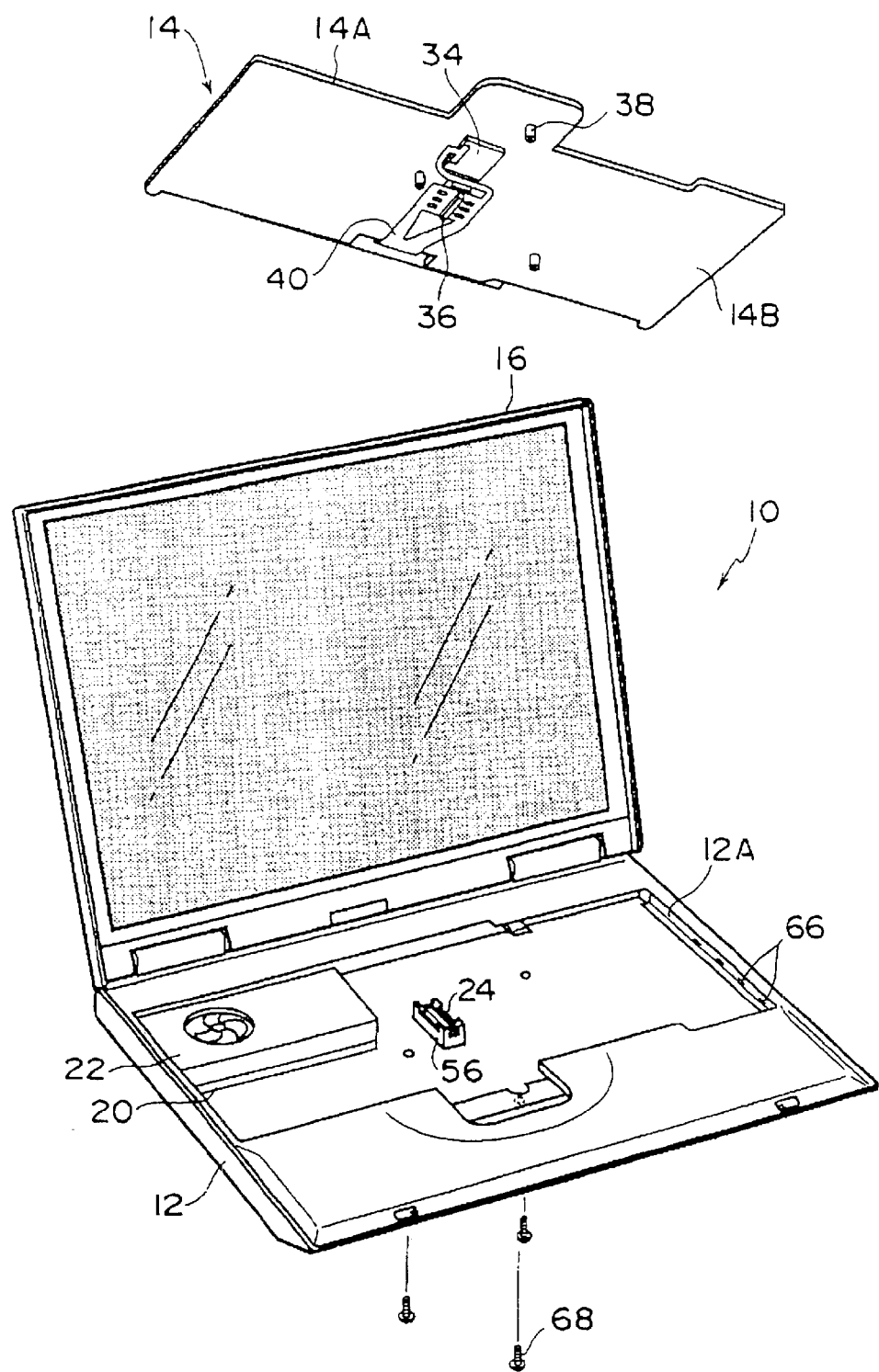
FIG. 3 is a perspective view of the keyboard unit shown in FIG. 2 with viewing from an installation side.

In a key-arranged side (front face) of the keyboard unit 14, a pointing device (track point: a trademark of IBM Corp.) 32 for moving a cursor, displayed on a screen of a liquid crystal display unit 16, at the time of PC operation is equipped. A sensor circuit board 34 for supporting this pointing device 32 and relaying an electric signal generated by the operation, as shown in FIG. 3, is mounted on an installation side 14B of the keyboard unit 14.

A connector 36 connected to a connector 24 of the mother board 28 and a supporting mechanism (details will be described later) supporting the connector 36 are located in the approximate center of the installation side 14B with being adjacent to the sensor circuit board 34. Furthermore, three columns 38, arranged as if the three columns 38 surrounded the sensor circuit board 34 and connector 36, are also provided on the installation side 14B.

Moreover, as before, the connector 36 according to this embodiment is surface-mounted on an FPC cable 40, and the FPC cable 40 transfers an electric signal by the operation of a key of the keyboard unit 14 and an output signal from the sensor circuit board 34. This FPC cable 40, as before, has such configuration that a pattern constituting an electric circuit is printed-wired inside a flexible and deformable flat substrate.

Next, a supporting mechanism of the connector 36 and a form of the flexible cable 38 will be described in detail.

Figure 4:
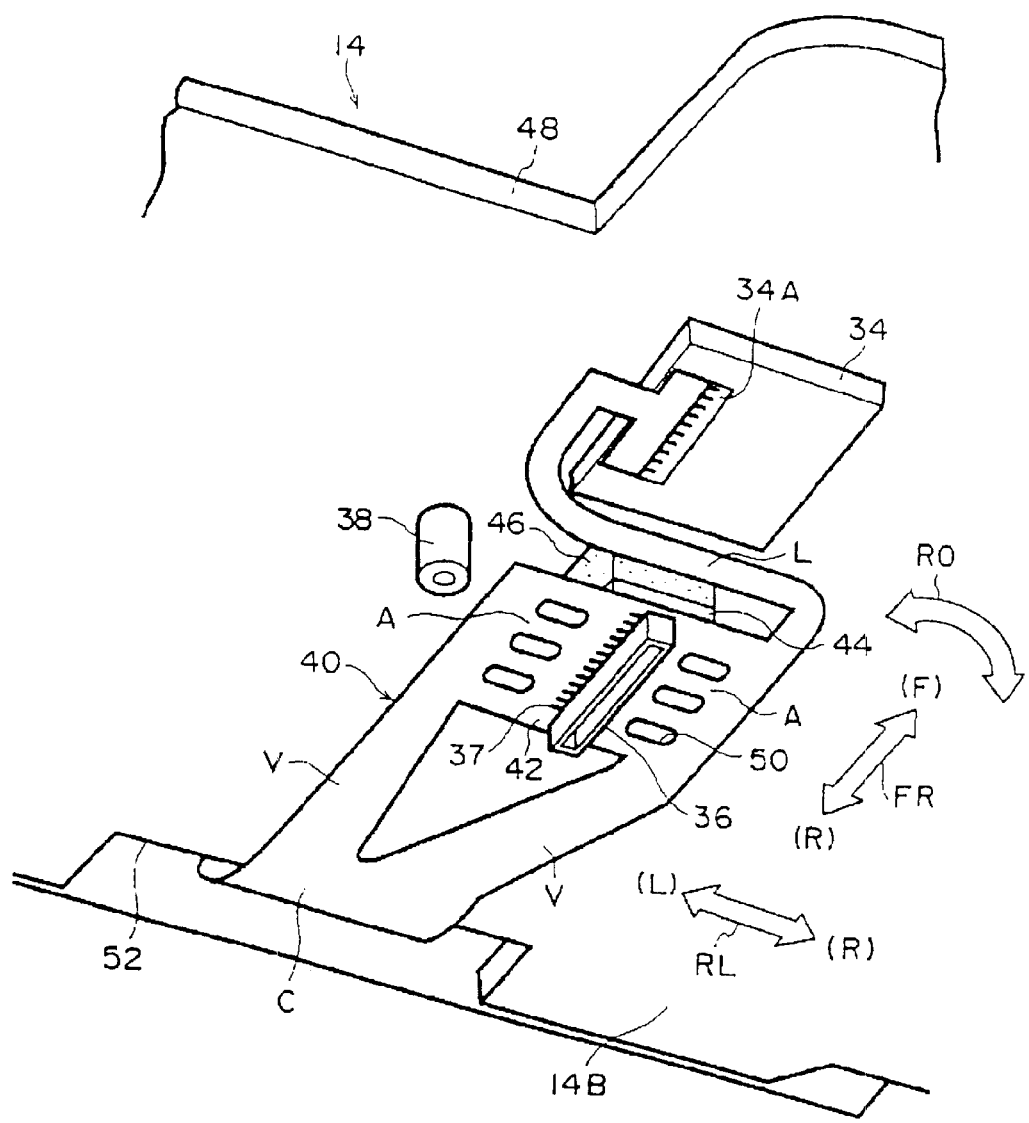
FIG. 4 is an enlarged perspective view showing the connector in the keyboard unit and its support mechanism according to an embodiment of the present invention.
Figure 5A:
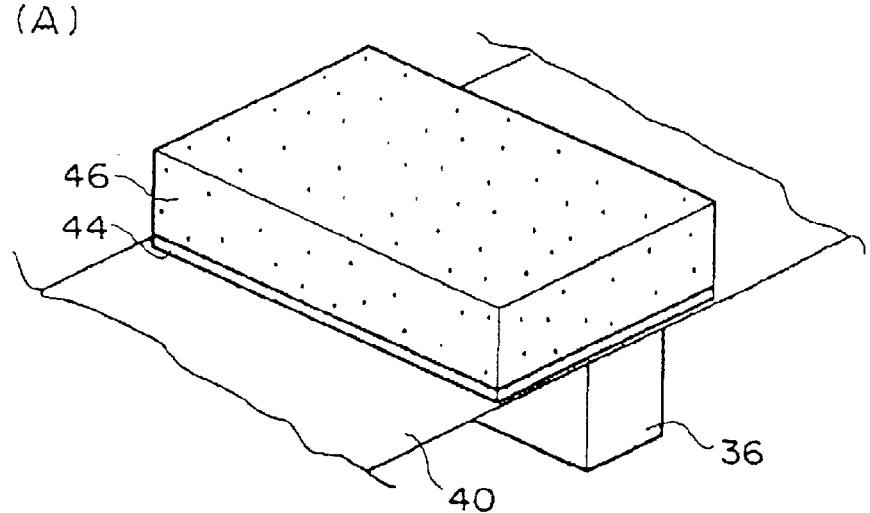
FIG. 5A is an enlarged perspective view of the connector and its support mechanism with viewing from an installation side to the keyboard unit shown in FIG. 4.

FIG. 4 is an enlarged perspective view of a periphery of the connector 36. FIG. 5A is an enlarged perspective view of the connector 36 with viewing the connector 36 from a backside.

As shown in FIGS. 4 and 5A, a support plate 44, which is made to be one size larger than a connector external form to contain leads 37 of connector 36, is fixed to a back side of a connector-mounted section 42 of the FPC cable 40.

For example, this support plate 44 is made of epoxy resin substrate or the like that contains glass, which has high stiffness and good thermal resistance and is little in a time-dependent change. Owing to this, the deformation of the connector-mounted section 42 is suppressed (a cable is kept to be flat), and a crack of a soldering section is prevented hereby.

On the support plate 44, a square cushion 46 is fixed to a surface facing the surface where the connector-mounted section 42 is fixed.

This cushion 46 has elasticity, and is made of urethane rubber having good thermal resistance and durability. In addition, the surface of the cushion 46 fixed to the support plate 44 is aligned in the size of the support plate 44, and its opposite side is fixed to a predetermined position of base plate 48 (made of aluminum) of the keyboard unit 14. Furthermore, the thickness of cushion 46 is such thickness that the connector 36 and connector 24 are connected with each other at adequate insertion depth in such a state that the keyboard unit 14 is mounted in the PC body 12.

Since an industrial double-sides tape is used for fixing these support plate 44 and cushion 46, fixing (adhesion) can be simply performed. However, it is good to use an adhesive or the like instead of this.

First of all, as a manufacturing procedure, the support plate 44 is fixed to the FPC cable 40 to secure the strength of the connector-mounted section 42, the connector 36 is implemented by reflow soldering, and thereafter, the cushion 46 is fixed to unify them. After the connector 36 and its support mechanism that are unified are aligned with an assembling jig or the like, and are fixed to the base plate 48.

In this manner, the connector 36 mounted on the base plate 48 through the cushion 46 is made to have a floating function in a front and back direction (direction shown by an arrow FR in FIG. 4), a right and left direction (direction shown by an arrow RL in FIG. 4) or a rotational direction (direction shown by an arrow RO in FIG. 4) against the keyboard unit 14 by the elastic deformation of the cushion 46.

Figure 6:
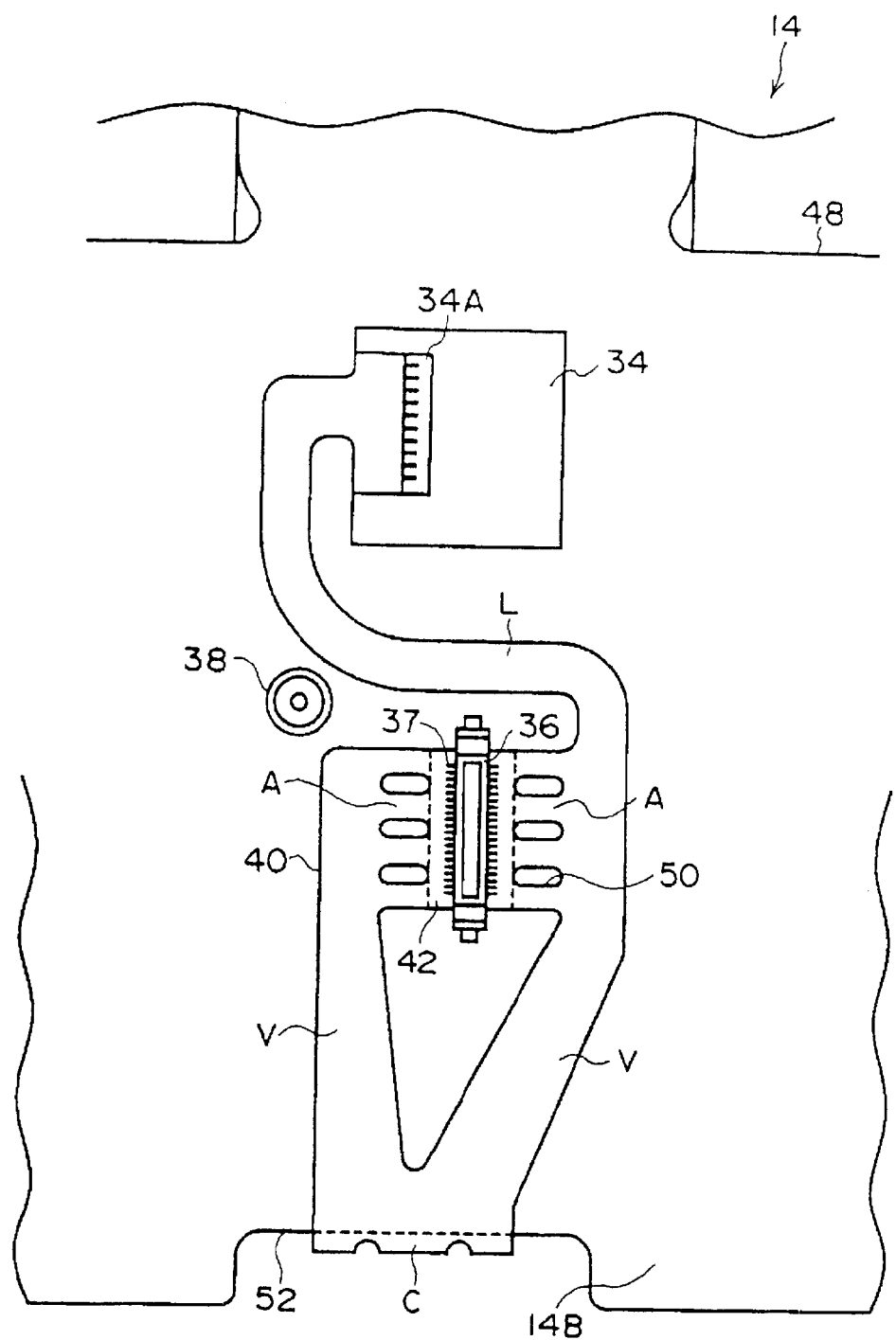
FIG. 6 is a plane view showing a principal section of the connector and a flexible cable in the keyboard unit according to an embodiment of the present invention.

On the other hand, as shown in FIGS. 4 and 6, the FPC cable 40 has a form of extending along the front and back direction of the keyboard unit 14 with the connector-mounted section 42 as the approximate center.

In addition, both sides of the connector-mounted section 42 have a form like costae (shown by A in FIGS. 4 and 6) with a plurality of slots 50 being provided, and a section linking therefrom to the rear (linking section to the keyboard unit 14) is formed in an approximate V form (V in FIGS. 4 and 6) with cables extending from both sides of the connector-mounted section 42 respectively. Furthermore, an end where the cable is connected (end of the approximate V form) is bent in a curled state (C in FIGS. 4 and 6) toward the inside of the keyboard unit 14 after passing through a notch 52 of the base plate 48, and is connected by soldering to an electrode section not shown.

In addition, a section linking from the connector-mounted section 42 to the front (connection side to the sensor circuit board 34) is formed in an approximate L form (L in FIGS. 4 and 6) with the cable extending from one end section of the connector-mounted section 42, and the end section is connected to an electrode section 34A of the sensor circuit board 34.

In this manner, the cable width of the FPC cable 40 around the connector-mounted section 42 is made to be thin and bent (nonlinear form), and can be easily bent by a tensile force in front and back, and left and right directions and a twisting force. Owing to this, the FPC cable 40 has such structure that the FPC cable 40 does not disturb the floating operation of the connector 36, and large stress is not applied to the cable 40 itself or soldered sections in both end sections of the cable 40.

Figure 5B:
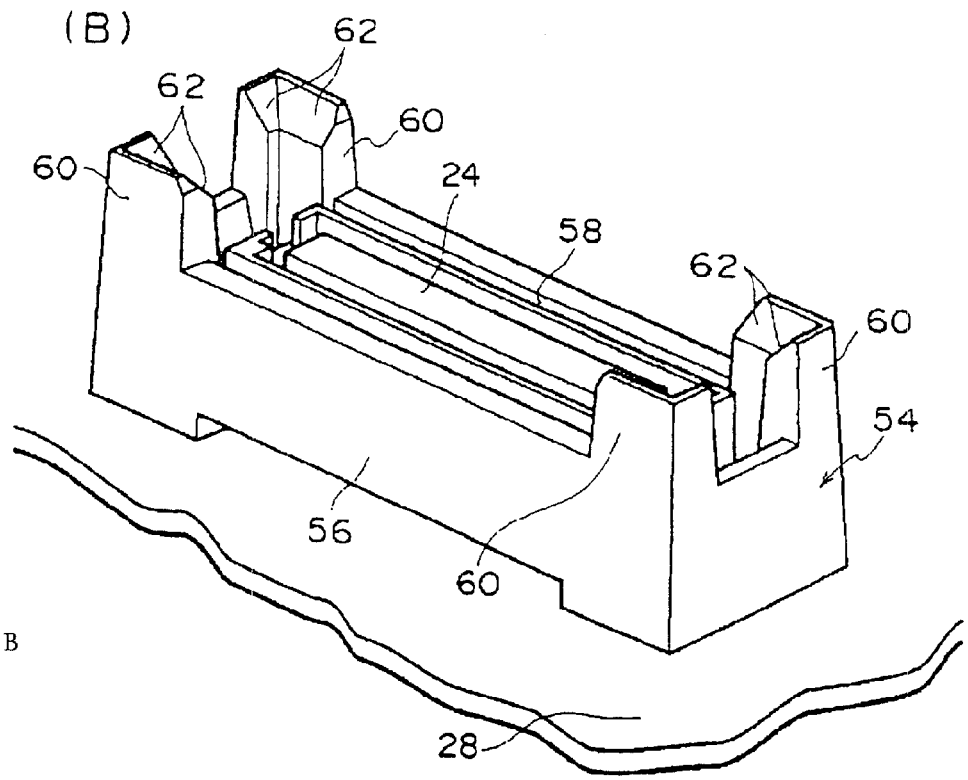
FIG. 5B is an enlarged perspective view of a connector and a connector guide in a mother board.

On the other hand, as shown in FIG. 5B, a pedestal-like connector guide 54 is attached to the connector 24 in the mother board 28.

The connector guide 54 is made of ABS resins, and has a rectangular hole 58, having the almost same size as that of an external form of a side section of the connector 24, in a guide body section 56, and is made to be fit with the connector 24 without play.

In addition, in each of the four corners of the guide body section 56, an arm section 60 with an approximate L-shaped horizontal cross-section is provided with protruding toward the external. Furthermore, a guide section 62 having a tapered shape expanding upward is formed in an upper section of an inner wall surface of each arm section 60.

Owing to this, when the connector 36 in the keyboard unit 14 is inserted in the connector 24 in the mother board 28, the connector 36 contacts with the guide section 62 of the connector guide 54, and is aligned with the connector 24.

As for 25% compression load when the load at the compression speed of 1 mm/min is applied to an urethane rubber test piece of 50 mm diameter, the load of the cushion 46 keeping a floating function in the connector 36 in this embodiment is approximately $7.8 \times 10^4$ Pa (approximately 0.8 kgf/cm$^2$). If this value is kept, a connector insertion failure is not generated in this embodiment where an insertion force of a connector is approximately 9.8 N (approximately 1 kgf), and inserting and extracting of connector is not a problem level. In addition, the size of cushion 46 is 18.8 mm long×11 mm wide×3 mm thick, traveling amounts of the connector 36 are secured by 1.5 mm (3 mm wide) each in left and right, and front and back directions, and hence the floating function to absorb the misalignment of the connectors is fulfilled.

Figure 7:
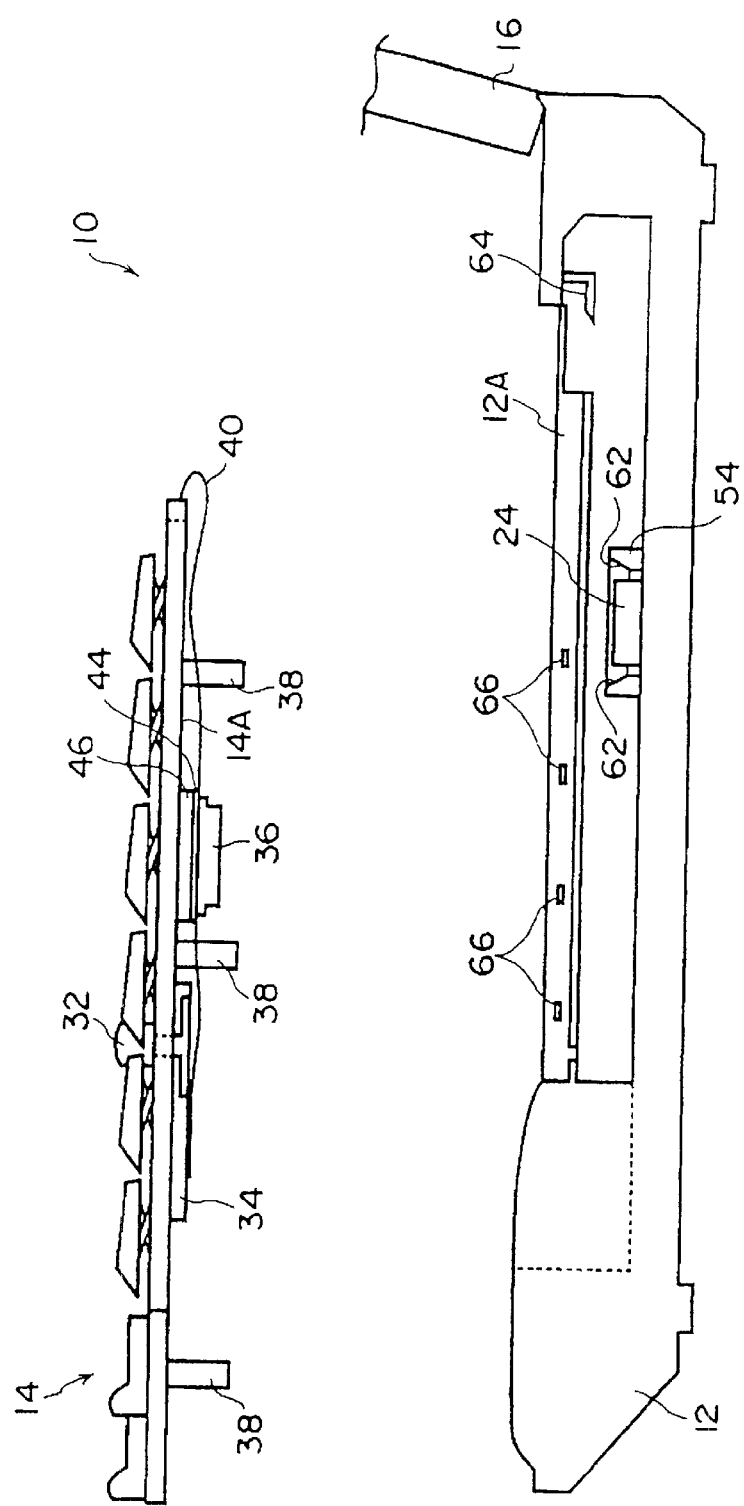
FIG. 7 is an explanatory diagram of procedure according to an embodiment of the present invention when the keyboard unit is mounted in the PC body, and is a schematic side cross-sectional view showing a state of mounting the keyboard unit.
Figure 8:
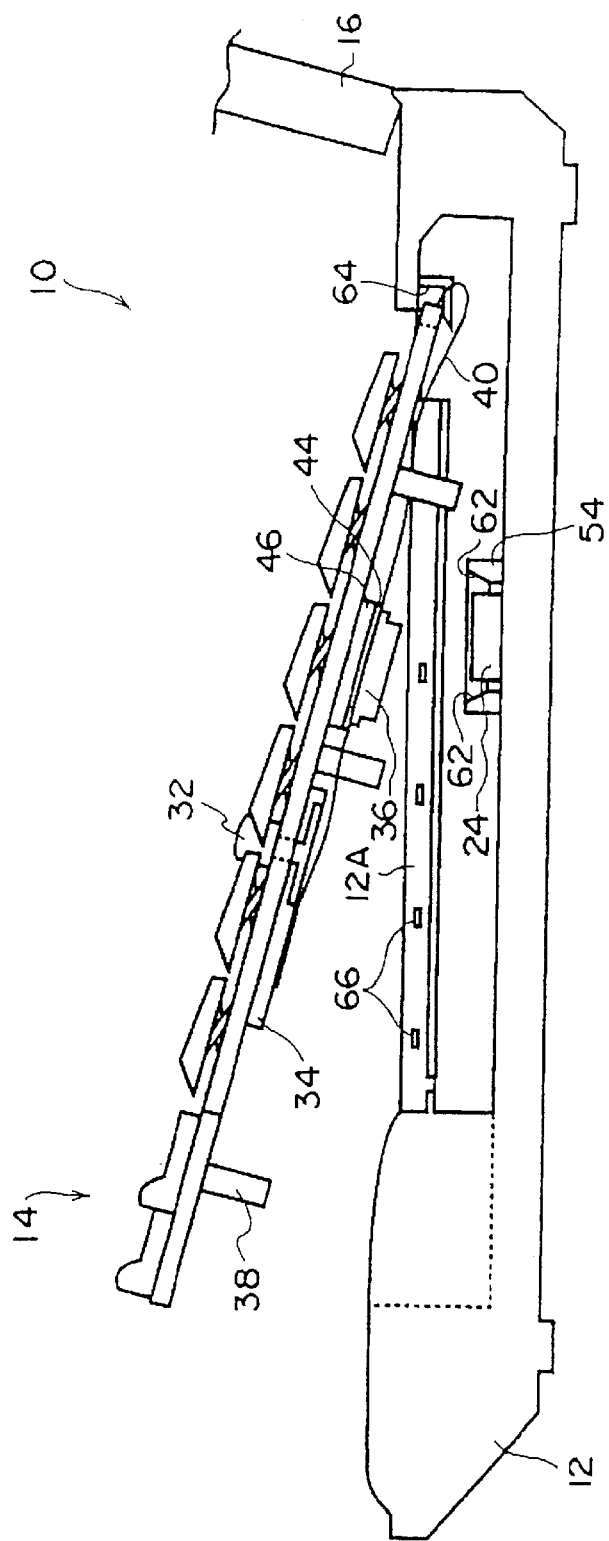
FIG. 8 is an explanatory diagram of procedure according to an embodiment of the present invention when the keyboard unit is mounted in the PC body, and is a schematic side cross-sectional view showing a state in process of mounting the keyboard unit.
Figure 9:
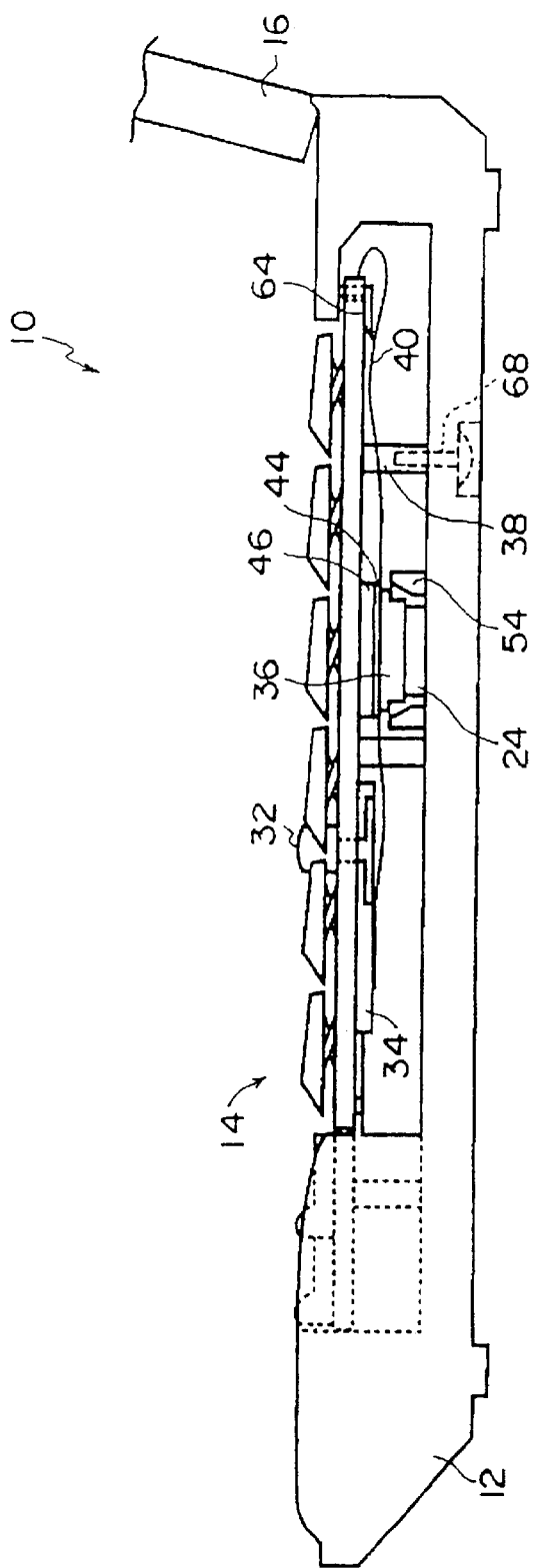
FIG. 9 is an explanatory diagram of procedure according to an embodiment of the present invention when the keyboard unit is mounted in the PC body, and is a schematic side cross-sectional view showing a state of completing the mounting of the keyboard unit.
Figure 10:
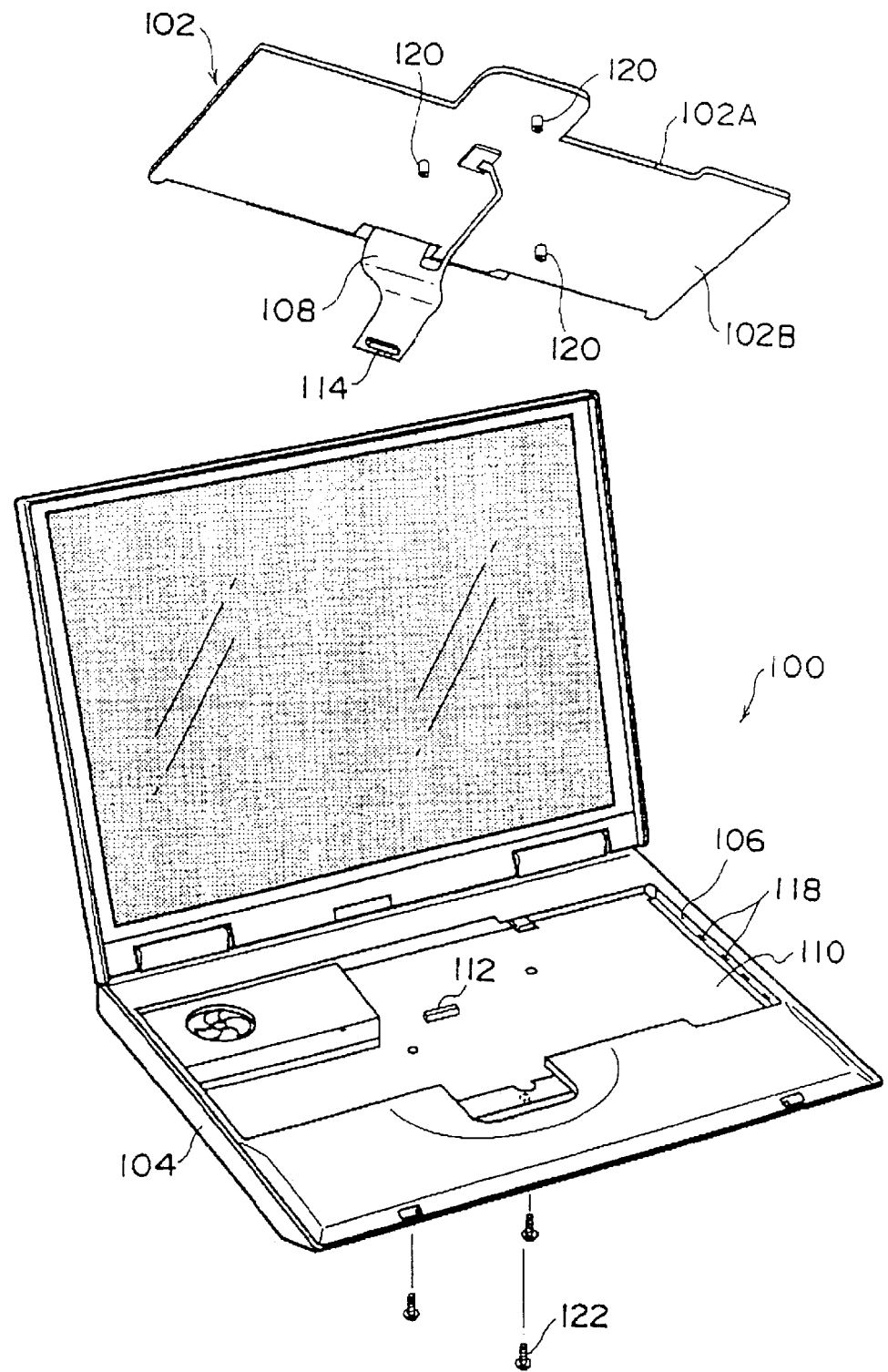
FIG. 10 is a perspective view showing a state of a keyboard unit being detached in a conventional notebook PC, and the keyboard with viewing from an installation side.
Figure 11:
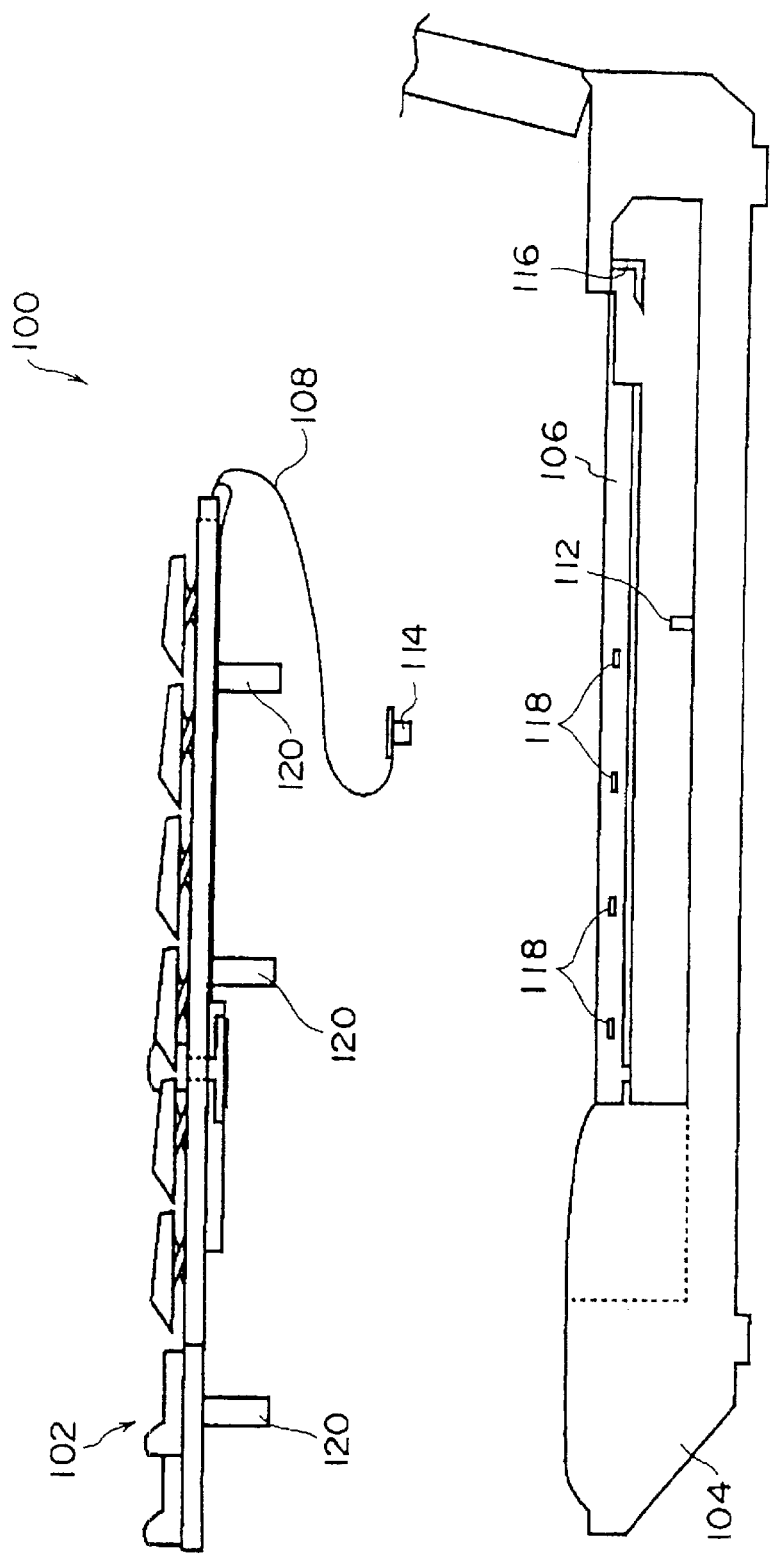
FIG. 11 is an explanatory diagram of procedure when a conventional keyboard unit is mounted in a PC body, and is a schematic side cross-sectional view showing a state of mounting the keyboard unit.
Figure 12:
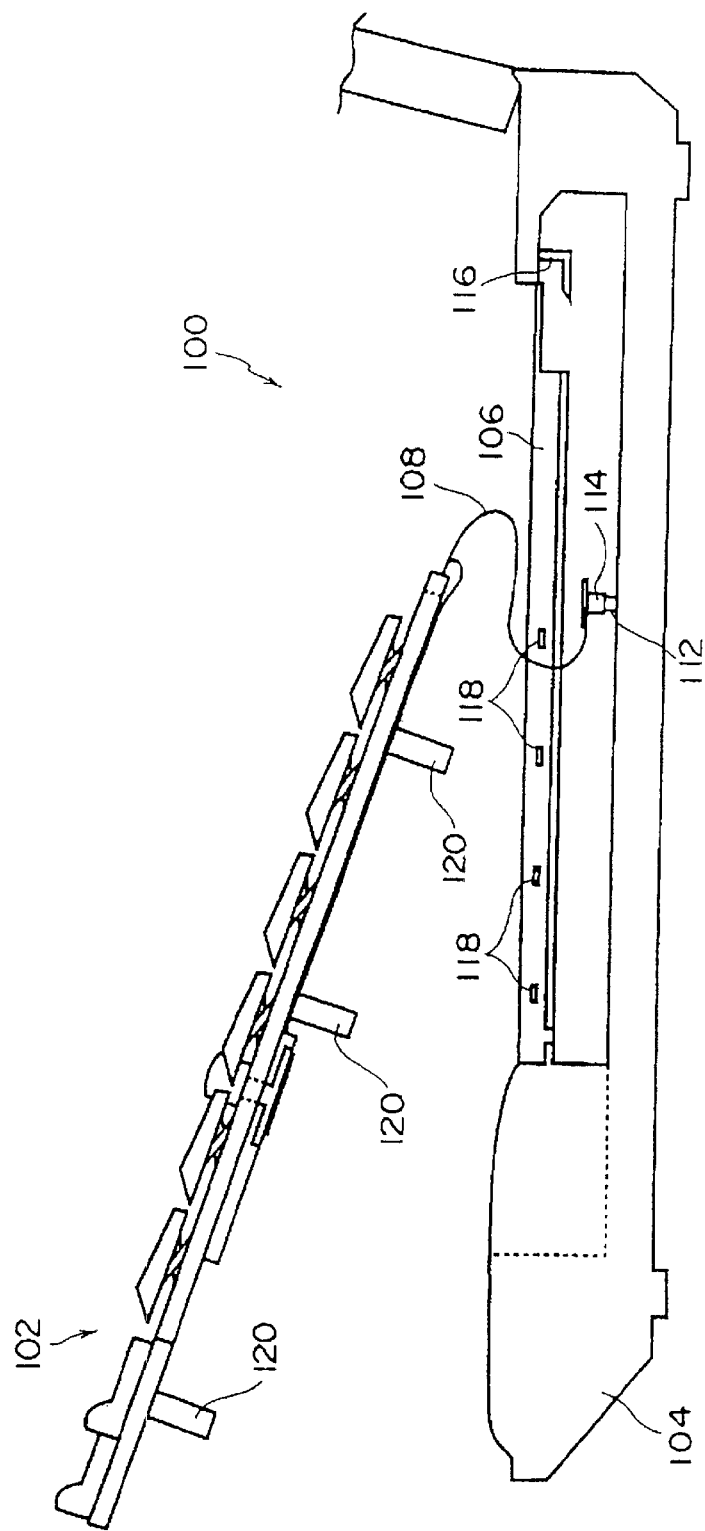
FIG. 12 is an explanatory diagram of procedure when the conventional keyboard unit is mounted in the PC body, and is a schematic side cross-sectional view showing a state in process of mounting the keyboard unit.
Figure 13:
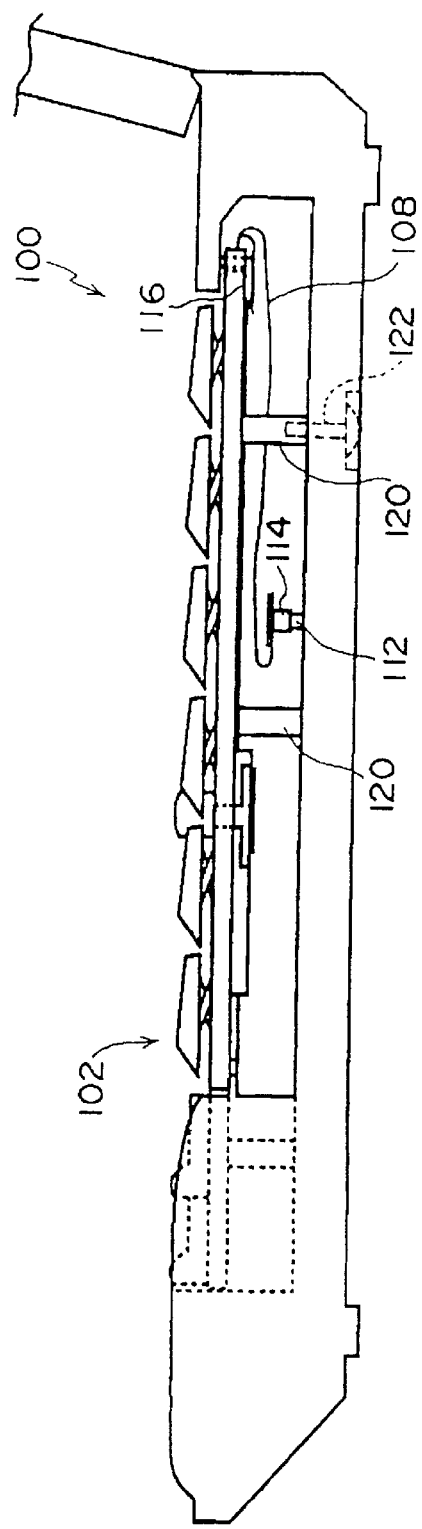
FIG. 13 is an explanatory diagram of procedure when the conventional keyboard unit is mounted in the PC body, and is a schematic side cross-sectional view showing a state of completing the mounting of the keyboard unit.

Next, actions of this embodiment will be described. FIGS. 7 to 9 show the procedure of mounting the keyboard unit 14 in the PC body 12.

First of all, when being mounted, the keyboard unit 14 is held with one hand or both hands, and is inclined from the posture shown in FIG. 7 to the posture shown in FIG. 8 for an end section of the keyboard unit 14 to be inserted into a receiving section 64 that is provided in the PC body 12 and has an approximately angular U-shaped cross-section.

In addition, as shown in FIG. 9, the keyboard unit 14 is inserted into a part-mounted section 12A as it is, and an outer peripheral section 14A is fit with the part-mounted section 12A. At this time, a latch 68 that is ejectably provided in an inner wall of each side of the part-mounted section 12A with protruding is engaged with the outer peripheral section 14A of the keyboard unit 14, and keeps the keyboard unit 14 temporary fixed.

Furthermore, at this time, the keyboard unit 14 is inserted in the part-receiving section 12A, and simultaneously, the connector 36 is directly inserted into the connector 24 with contacting to the guide section 62 (tapered section) of the connector guide 54 and being aligned with the connector 24. Accordingly it is not necessary to insert the connector 36 with extra manual work.

In addition, here, the keyboard unit 14 is made to be mounted with rotating in a direction parallel to a front and back direction of the PC body 12 with the end section of the keyboard unit 14 as a fulcrum, and on the other hand, the connector 24 and connector 36 are made so that their longitudinal directions match with the front and back direction of the PC body 12. Accordingly connector connection with mounting of the keyboard unit 14 is smoothly performed.

Furthermore, in this embodiment, the configuration of movably supporting the connector 36 (floating function) is implemented with the cushion 46 made of urethane rubber. Therefore, an elastic body made of rubber like this has sufficiently large restraint for traveling in an insertion direction (deformation of the cushion 46 in a compressive direction) rather than traveling in the front and back as well as left and right direction of the connector 36 (deformation of the cushion 46 in a shearing direction). Hence the connector 36 is securely inserted with the mounting of the keyboard unit 14. However, in order to adopt all possible measures, it is good to give light press to a periphery of the connector 36 from the key-arranged side after tentative fix of the keyboard unit 14.

Finally, similarly to the past, the keyboard unit 14 is fixed to each column 38 of the keyboard unit 14 with screwing the keyboard unit 14 with a screw 68 from a bottom face (installation face) of the PC body 12.

In addition, when the keyboard unit 14 is detached, the keyboard unit 14 is lifted from the part-receiving section 12A with pushing a predetermined column 38 from the bottom side of the PC body 12 after removing the screws 68, and the keyboard unit 14 is seized and removed as it is. At this time also, when the connector 36 in the keyboard unit 14 is detached from the connector 24 in the mother board 28 at the same time when the column 38 is pushed and the keyboard unit 14 is detached from the part-receiving section 12A, and hence, it is unnecessary to touch the connector 36.

As described above, in the electric connecting structure of a mounted part according to this embodiment, the connector 36 that is inserted is supported by the cushion 46 having elasticity, and the cushion 46 is provided on the mounted surface 14B of the keyboard unit 14, and hence, the connector 36 can be relatively moved to the keyboard unit 14.

Owing to this, the connector 36 is inserted into the connector 24 on the mother board 28 at the same time when the keyboard unit 14 is mounted in the PC body 12. In addition, even if misalignment arises between the connectors 36 and 24, the cushion 46 is elastically deformed according to an amount of the misalignment, the connector 36 is moved, and hence adequate connection is performed.

In this manner, since the misalignment between both connectors 36 and 24 is absorbed by the cushion 46, large stress is not applied to both connectors after connection, and hence this is advantageous in damage in comparison with a case that connectors are fixedly mounted.

Furthermore, the flexible and deformable FPC cable 40 is used for electrically connecting the connector 36 to the keyboard unit 14 and sensor circuit board 34. Owing to this, the movement of the connector 36 is not disturbed.

In particular, in this embodiment, the FPC cable 40 has such a form that the FPC cable 40 absorbs the stress applied to the connector 36 when the connector 36 is connected to the connector 24. In other words, the FPC cable 40 has a thin cable, a plurality of slots 50, combined sections having an approximately costae-like form, an approximate V form, and an approximate L form, and a section having a coiled form (FIGS. 4 and 6). Owing to this, even when the connector 36 is moved, the force acting on the FPC cable 40 by the movement is relieved by the flexible deformation of the cable.

Owing to this, excessive stress is not applied to the leads 37 of the connector 36, which is surface-mounted on the FPC cable 40, and the soldered sections located in both ends of the FPC cable 40, and hence it is possible to prevent a continuity failure and damage that are caused by a crack or the like.

In addition, in this embodiment, when the keyboard unit 14 is mounted in the PC body 12, the connector guide 54 aligning (guiding) the connector 36 with the connector 24 is provided, and hence it is possible to securely and smoothly connect the connectors 36 and 24 with mounting the keyboard unit 14.

Furthermore, in this embodiment, the connector 36 implemented in the connector-mounted section 42 of FPC cable 40 is mounted in the keyboard unit 14 through the support plate 44 and cushion 46. Hence by just removing the keyboard unit 14 from the PC body 12, the connection of the connectors 36 and 24 is released.

Accordingly it is possible without paying attention to the connector 36 to insert or detach the connector 36 when the keyboard unit 14 is inserted into or detached from the PC body 12, and hence the work becomes simple. In addition, by omitting the manual connection of the connectors 36 and 24, it becomes possible to prevent the poor connection such as half locking, and in addition, it is unnecessary to pay attention lest the FPC cable 40 should be pinched or caught. Therefore, even if any person irrespective of whether the person is a service person or a user performs the work, it is possible to obtain stable quality.

In consideration of facts that mounting and detaching of a keyboard unit frequently occurs in service centers for repair, and in memory expansion and exchange of hard disk drives by users besides it, this is an excellent effect.

In addition, in this embodiment, the cushion 46 is made of urethane rubber, and hence it is possible to implement the mechanism of movably supporting the connector 36 in low cost. Furthermore, it is possible to maintain desired elasticity even if the cushion 46 is put in a high-temperature environment by driving the notebook PC 10 because the cushion 46 is strong for heat deterioration. Accordingly, since there is no problem even if the mother board 28 and the base plate 48 of the keyboard unit 14 are bent to some extent by the driving heat, it is possible to fulfill the floating function of the connector 36.

In addition, in this embodiment, the connector 36, provided in the keyboard unit 14 that is mounted, is made to have the floating function, but it is possible to make the connector 24 have the function by movably constituting the connector 24 in the PC body 12. Furthermore, it is also good to move both connectors.

In addition, as for directions of the connectors 24 and 36, the longitudinal directions of the connectors 24 and 36 are fit to the front and back direction of the PC body 12, but it is possible to adequately change the directions according to a form of mounting a mounted part. For example, it is possible to arrange the connectors 24 and 36 in the direction orthogonal to the direction of this embodiment.

In addition, the electric connecting structure of a mounted part according to this embodiment can be applied to electronic equipment besides a notebook PC so long as the electronic equipment has such configuration that a mounted part is mounted on a part-receiving part and they are connected with connectors.

Although the present invention is described on the basis of embodiments, the effect of the present invention is not restricted by any specific embodiment except being limited by the appended claims.

Since the electrical connecting structure of a mounted part according to the present invention is as described above, it becomes easy to insert and detach a connector when the mounted part is mounted in or dismounted from a part-receiving part. In addition, it is possible to prevent the damage of a connector and a cable member when the mounted part is mounted and dismounted.

What is claimed is:

1. An electrical connecting structure for electrically connecting a component constituting a part of an electronic equipment to another part of the electronic equipment by fitting the component to another part of the electronic equipment, the structure comprising:

a first connector provided in the component;

a support member situated at least partially between the first connector and the component movably supporting the first connector in the component;

a second connector provided in the another part of the electronic equipment, the second connector to be used for connecting with the first connector;

wherein the first connector is connected to an electronic circuit mounted on the component through a flexible cable, wherein said flexible cable is a flexible printed-circuit cable in which an electric circuit is formed on a flexible and deformable flat substrate by printed-wiring, the first connector is surface-mounted on the flexible printed-circuit cable, and the flexible printed-circuit cable has a form of absorbing a force applied to the first connector when the first connector and the second connector are connected to each other; and wherein one of the component or and the another part of the electronic equipment includes a guide member for connecting the first connector to the second connector when the component is fitted to the another part of the electronic equipment, and wherein the guide member comprises at least four arms extending in a direction away from the one of the component and the another part of the electronic equipment, each arm situated in a corner of the guide member and comprising a tapered section for assisting in alignment of the first connector and the second connector.

2. The electrical connecting structure according to claim 1, wherein the support member is an elastic body made of a high molecular compound.

3. The electrical connecting structure according to claim 2, wherein the elastic body is made of urethane rubber.

4. An electrical connecting structure for electrically connecting a component constituting a part of an electronic equipment to another part of the electronic equipment by fitting the component to another part of the electronic equipment, the structure comprising:

a first connector provided in the component;

a support member situated at least partially between the first connector and the component movably supporting the first connector in the component;

a second connector provided in the another part of the electronic equipment, the second connector to be used for connecting with the first connector;

wherein the first connector is connected to an electronic circuit mounted on the component through a flexible cable; and wherein one of the component or-and the another part of the electronic equipment includes a guide member for connecting the first connector to the second connector when the component is fitted to the another part of the electronic equipment, and wherein the guide member comprises at least four arms extending in a direction away from the one of the component and the another part of the electronic equipment, each arm situated in a corner of the guide member and comprising a tapered section for assisting in alignment of the first connector and the second connector.

5. The electrical connecting structure according to claim 4, wherein the support member is an elastic body made of a high molecular compound.

6. The electrical connecting structure according to claim 5, wherein the elastic body is made of urethane rubber.

7. An electrical connecting structure for electrically connecting a component constituting a part of an electronic equipment to another part of the electronic equipment by fitting the component to another part of the electronic equipment, the structure comprising:

a first connector provided in the component;

a support member situated at least partially between the first connector and the component movably supporting the first connector in the component;

a second connector provided in the another part of the electronic equipment, the second connector to be used for connecting with the first connector;

wherein the first connector is connected to an electronic circuit mounted on the component through a flexible cable; and wherein one of the component or-and the another part of the electronic equipment includes a guide member for connecting the first connector to the second connector when the component is fitted to the another part of the electronic equipment, and wherein the guide member comprises at least four arms extending in a direction away from the one of the component and the another part of the electronic equipment, each arm situated in a corner of the guide member and comprising a tapered section for assisting in alignment of the first connector and the second connector.

8. The electrical connecting structure according to claim 7, wherein the support member is an elastic body made of a high molecular compound.

9. The electrical connecting structure according to claim 8, wherein the elastic body is made of urethane rubber.

10. An electrical connecting structure for electrically connecting a component constituting a part of an electronic equipment to another part of the electronic equipment by fitting the component to another part of the electronic equipment, the structure comprising:

a first connector provided in another part of the electronic equipment;

a support member situated at least partially between the first connector and the another part of the electronic equipment movably supporting the first connector in the another part of the electronic equipment;

a second connector provided in the component, the second connector to be used for connecting with the first connector;

wherein said first connector is connected to an electronic circuit mounted on the another part of the electronic equipment through a flexible cable; and wherein one of the component or-and the another part of the electronic equipment includes a guide member for connecting the first connector to the second connector when the component is fitted to the another part of the electronic equipment, and wherein the guide member comprises at least four arms extending in a direction away from the one of the component and the another part of the electronic equipment, each arm situated in a corner of the guide member and comprising a tapered section for assisting in alignment of the first connector and the second connector.

11. The electrical connecting structure according to claim 10, wherein the support member is an elastic body made of a high molecular compound.

12. The electrical connecting structure according to claim 11, wherein the elastic body is made of urethane rubber.

13. An electrical connecting structure for a keyboard of a notebook computer, comprising:

a first connector physically coupled to one of the keyboard and another component in the notebook computer;

a support member situated at least partially between the first connector and the one of the keyboard and another component movably supporting the first connector; and a second connector physically coupled to the other of the keyboard and the another component;

wherein the one of the first connector and second connector physically coupled to the keyboard is also electrically coupled to the keyboard via a flexible cable; and wherein one of the keyboard and the another component in the notebook computer includes a guide member for connecting the first connector to the second connector when the keyboard is fitted to the another component in the notebook computer, and wherein the guide member comprises at least four arms extending in a direction away from the one of the keyboard and the another component in the notebook computer, each arm situated in a corner of the guide member and comprising a tapered section for assisting in alignment of the first connector and the second connector.

14. The electrical connecting structure according to claim 13, wherein the guide member is physically coupled to the second connector.

15. The electrical connecting structure according to claim 13, wherein said flexible cable is a flexible printed-circiut cable in which an electric circuit is formed on a flexible and deformable flat substrate by printed-wiring, the one of the first connector and second connector is surface-mounted on the flexible printed-circuit cable, and the flexible printed-circuit cable has a form of absorbing a force applied to the one of the first connector and second connector when the first connector and the second connector are connected to each other.

16. The electrical connecting structure according to claim 13, wherein the support member comprises an elastic body made of a high molecular compound.

17. The electrical connecting structure according to claim 16, wherein the elastic body comprises urethane rubber.

* * * * *

UNITED STATES PATENT AND TRADEMARK OFFICE
CERTIFICATE OF CORRECTION

PATENT NO. : 6,595,786 B2
DATED : July 22, 2003
INVENTOR(S) : Horiuchi et al.

It is certified that error appears in the above-identified patent and that said Letters Patent is hereby corrected as shown below:

Column 12,
Line 20, delete the words "or and" and insert -- and --
Line 52, delete the words "or-and" and insert -- and --

Column 13,
Lines 16 and 51, delete the words "or-and" and insert -- and --

Signed and Sealed this

Ninth Day of September, 2003

JAMES E. ROGAN
*Director of the United States Patent and Trademark Office*